United States Patent [19]

Aoshima et al.

[11] Patent Number: 4,864,222

[45] Date of Patent: Sep. 5, 1989

[54] VOLTAGE DETECTOR EMPLOYING ELECTRO-OPTIC MATERIAL HAVING A CORNER-CUBE SHAPE

[75] Inventors: Shinichiro Aoshima; Yutaka Tsuchiya, both of Shizuoka, Japan

[73] Assignee: Hamamatsu Photonics Kabushiki Kaisha, Shizuoka, Japan

[21] Appl. No.: 233,090

[22] Filed: Aug. 15, 1988

[30] Foreign Application Priority Data

Aug. 17, 1987 [JP] Japan .............................. 62-203921

[51] Int. Cl.$^4$ ..................... G01R 31/00; G01R 19/00; G02B 5/122
[52] U.S. Cl. ........................................ 324/96; 324/72; 324/117 R; 324/158 R; 350/102; 350/356
[58] Field of Search ................... 324/96, 158 R, 77 K, 324/117 R, 72; 350/102, 356, 374, 376; 356/368

[56] References Cited

U.S. PATENT DOCUMENTS

| | | | |
|---|---|---|---|
| 4,446,425 | 5/1984 | Valdmanis et al. | 324/77 K |
| 4,603,293 | 7/1986 | Mourou et al. | 324/96 |
| 4,618,819 | 10/1986 | Mourou et al. | 324/77 K |
| 4,745,361 | 5/1988 | Nees et al. | 324/158 R |

FOREIGN PATENT DOCUMENTS 0197196 10/1986 European Pat. Off. .

OTHER PUBLICATIONS

Williamson, S. et al., "Picosecond Electro-Electron Optic Oscilloscope", Proc. Conf. Picosecond Electron. Optoelectron., pp. 58–61, (N.Y. Springer-Verlag), 1985.
Kolner, B. H. et al., "Electrooptic Sampling in GaAs Integrated Circuits", IEEE Journal of Quantum Electronics, vol. ge-22, pp. 79–93, Jan. 1987.
Nees, J. et al., "Noncontact Electro-Optic Sampling with a GaAs Injection Laser", Electronics Letters, vol. 22, No. 17, pp. 918–919, Aug. 1986.
Valdmanis, J. A. et al., "Electro-Optic Sampling: Testing Picosecond Electronics Part 1. Principles and Embodiments", Laser Focus/Electro-Optics, pp. 84–96, Feb. 1986.
Valdmanis, J. A. et al., "Electro-Optic Sampling: Testing Picosecond Electronics Part 2. Applications", Laser Focus/Electro-Optics, pp. 96–106, Mar. 1986.
Valdmanis, J. A. et al., "Subpicosecond Electrical Sampling and Applications", Picosecond Optoelectronic Devices, pp. 249–270, 1984.
Kolner, B. H. et al., "Electro-optic Sampling with Picosecond Resolution", Electronics Letters, vol. 19, No. 15, pp. 574–575, Jul. 1983.
Tsuchiya, Y., "Advances in Streak Camera Instrumentation for the Study of Biological and Physical Processes", IEEE Journal of Quantum Electronics, vol. qe-20, No. 12, pp. 1516–1528, Dec. 1984.
Valdmanis, J. A., "High-Speed Optical Electronics: The Picosecond Optical Oscilloscope", Solid State Technology/Test and Measurement World, pp. S40–S44, Nov. 1986.
U.S. Patent Application Ser. No. 199,350, filed May 26, 1988.
Valdmanis, J. A. et al., "Subpicosecond Electrooptic Sampling: Principles and Applications", IEEE Journal of Quantum Electronics, vol. qe-22, No. 1, pp. 69–78, Jan. 1986.
Valdmanis, J. A. et al., "Picosecond Electrooptic Sampling System", Appl. Phys. Lett., vol. 41, No. 3, pp. 211–212, Aug. 1982.
Valdmanis, J. A. et al., "Subpicosecond Electrical Sampling", IEEE Journal of Quantum Electronics, vol. qe-19, No. 4, pp. 664–667, Apr. 1983.

*Primary Examiner*—Ernest F. Karlsen
*Attorney, Agent, or Firm*—Finnegan, Henderson, Farabow, Garrett, & Dunner

[57] ABSTRACT

In a voltage detector using an electro-optic material whose refractive index is changed by a voltage developing in a selected area of an object under test, an end portion of the electro-optic material has a corner-cube shape, whereby the detection of the voltage can be accurately achieved substantially being free from the influence of the input light tilt to the optical axis.

3 Claims, 2 Drawing Sheets

VOLTAGE DETECTOR EMPLOYING ELECTRO-OPTIC MATERIAL HAVING A CORNER-CUBE SHAPE

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong demand exists in the art for detecting such rapidly changing voltage with high precision without affecting the condition of the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by the electron beam.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by the present inventors (Japanese Patent Application No. 137317/1987 filed on May 30, 1987) that voltage be detected by making use of the polarization of a light beam that changes with the voltage developing in a selected area of an object to be measured.

A voltage detector operating on this principle is schematically shown in FIG. 4. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 through a condenser lens 60; an optical fiber 92 for guiding reference light from the optical probe 52 into a photoelectric converter 55 through a collimator 90; an optical fiber 93 for guiding output light from the optical probe 52 into a photoelectric converter 58 through a collimator 91; and a comparator circuit 61 for comparing the electric signals from the photoelectric converters 55 and 58.

The optical probe 52 is equipped with an electro-optic material 62 such as an optically uniaxial crystal of lithium tantalate ($LiTaO_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizing beam splitter 56 that extracts from the light beam passing through the collimator 94 reference light having a predetermined linear polarization component and input light to be launched into the electro-optic material 62 having a linear polarization component perpendicular to that of the reference light, and also extracts output light having a predetermined polarized component from a light beam emerging from the electro-optic material 62. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 4 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94, and then into the polarizing beam splitter 56 in the optical probe 52. Each of the reference light and the input light, which are produced by passage through the polarizing beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflection mirror 65 and makes a return trip through the electro-optic material 62, from which it emerges and travels back to the polarizing beam splitter 56. If the length of the tip 63 of the electro-optic material 62 is written as l, the state of polarization of input light launched into that material will change in proportion to the difference between refractive indices for the ordinary ray and the extraordinary ray and to the length 2l as well. The output light that is fed back into the polarizing beam splitter 56 after experiencing a change in the state of its polarization is changed from I/4 to $(I/4)\sin^2[(\pi/2)V/V_0]$ in the polarizing beam splitter 56 before it is further fed into the photoelectric converter 58. In the formula expressing the intensity of output light emerging from the polarizing beam splitter 56, V is the voltage developing in the object to be measured, and $V_0$ is a half-wave voltage.

In the comparator circuit 61, the intensity of reference light, or I/2, is compared with the intensity of output light, or $(I/4)\sin^2[(\pi/2)V/V_0]$, in the form of electric signals produced from respective photoelectric converters 55 and 58.

The intensity of output light, or $(I/4)\sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 4, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions.

As was described above, in the voltage detector of FIG. 4, the reflection mirror 65 is provided on the end portion 63 of the electro-optic material 62. Therefore, the voltage detector suffers from a difficulty that if the surface of the reflection mirror 65 is not accurately vertical to the optical axis (central axis of the electro-optic material), then in the electro-optic material 62 the optical path of the input light beam is not coincided with that of the output light beam, so that the voltage cannot be detected with high accuracy. Therefore, in installation of the reflection mirror 65, formation of even a small angle of inclination with the optical axis is not permitted, and the end portion 63 of the electro-optic material 62 must be manufactured with extremely high precision.

SUMMARY OF THE INVENTION

Accordingly, an object of this invention is to provide a voltage detector in which detection of a voltage developing in a selected area of an object under measurement can be achieved substantially being free from the condition of the end portion of the electro-optic material.

The foregoing object and other objects of the invention have been achieved by the provision of a voltage detector using an electro-optic material whose refractive index is changed by a voltage developing in a selected area of an object under measurement, in which, according to the invention, the end portion of the electro-optic material has a corner-cube shape.

In the voltage detector of the invention, as the end portion of the electro-optic material has the cornercube shape, the input light beam applied to the electro-optic material is reflected by the end portion of the electro-optic material and becomes an output light beam emerging from the electro-optic material. In this operation, even if the end portion is somewhat inclined with respect to the optical axis, the output light beam is in parallel with the input light beam, and therefore, the output light beam can be positively detected. Since the output light beam exists near the input light path, the output light beam can be positively detected even at a position far from the electro-optic material.

The nature, principle and utility of the invention will become more apparent from the following detailed description when read in conjunction with the accompanying drawings.

DETAILED DESCRIPTION OF THE PREFERRED EMBODIMENTS

Figure 4:
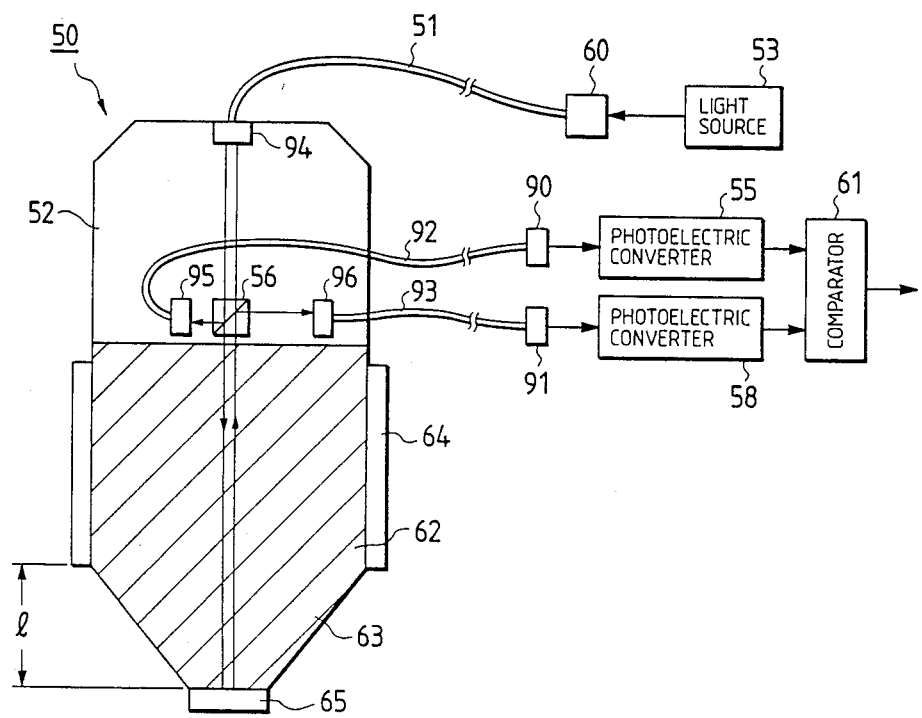
FIG. 4 is an explanatory diagram showing the arrangement of a voltage detector using an electro-optic material which was proposed in Japanese Patent Application No. 137317/1987.

The first example of a voltage detector according to this invention will be described with reference to FIG. 1, where the same parts as those in FIG. 4 are omitted.

Figure 1A:
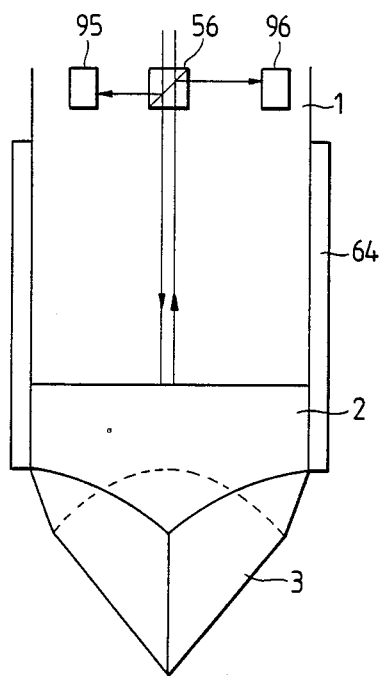
FIG. 1(a) is a schematic diagram showing the arrangement of one example of a voltage detector according to this invention.
Figure 1B:
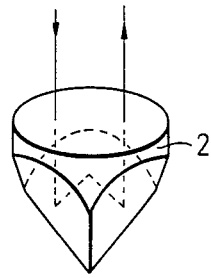
FIG. 1(b) illustrates a light path in an electro-optic material.

As shown in FIG. 1(a), an electro-optic material 2 is included in an optical probe 1, and its end portion 3 has a corner-cube shape (a shape of retroreflector), and an electrically conductive electrode 64 is provided on the side wall of the optical probe 1.

In the voltage detector, a light beam having a predetermined polarization component extracted by a polarizing beam splitter 56 is applied, as an input light beam, to the electro-optic material 2, advances to the end portion 3. Since the end portion 3 has the corner-cube shape, the input light beam is subjected to three times of total internal reflection by surfaces of the end portion 3 (refer to FIG. 1(b)) and returned, as an output light beam, to the polarizing beam splitter 56. Even when the input light beam is inclined, having an incidence angle in a range of from +20° to −20°, the corner-cube end portion 3 allows the output light beam to advance in parallel with the input light beam. Therefore, in the voltage detector of the invention, unlike the voltage detector having the reflection mirror 65 (FIG. 4) at the end of the electro-optic material, even when the end portion 3 is installed somewhat tilted, the output light beam is positively returned to the polarizing beam splitter 56. Since the output light beam exists near the input light path, the output light beam can be positively detected even at a position far from the electro-optic material 2.

In the case where the polarizing beam splitter 56 is a cube-prism type, if the input light beam is perpendicularly made incident on an incidence surface of the polarizing beam splitter 56, the output light beam is perpendicularly outputted from an emergence surface of the beam splitter 56 so that the output light beam can be detected more easily.

In order to more positively return the output light beam to the beam splitter 56, the input light beam should be applied to the central region of the end portion 3. This is because the output light path can be made almost coincident with the input light beam path.

As is apparent from FIG. 1(a), the end portion 3 is sharp, and therefore the optical probe 1 can be readily handled. Furthermore, it is unnecessary for the optical probe 1 to have the reflection mirror 65, and therefore the voltage detector of the invention can be much simplified in construction.

Figure 2:
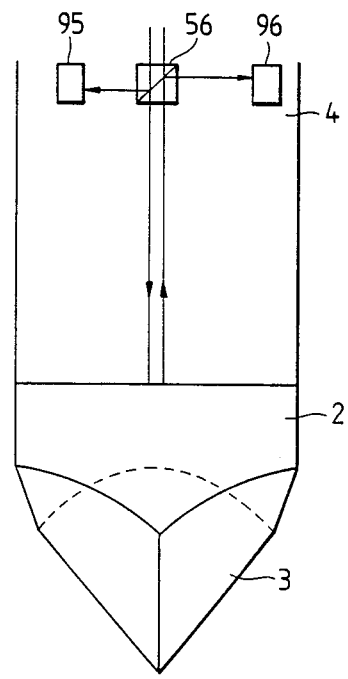
FIG. 2 is a schematic diagram showing one modification of the voltage detector shown in FIG. 1.
Figure 3:
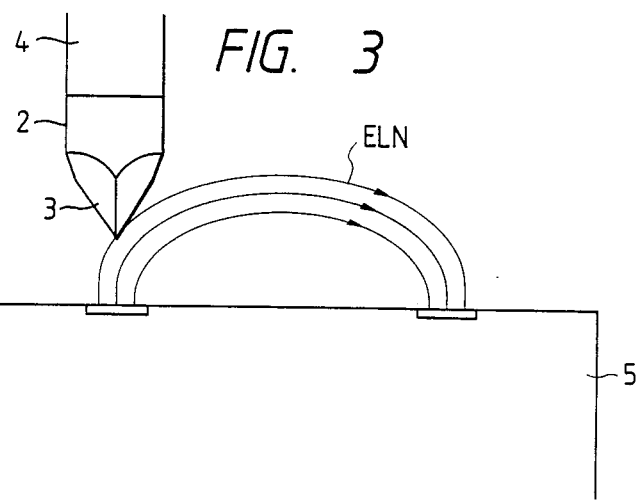
FIG. 3 is an explanatory diagram showing an operating situation of the voltage detector shown in FIG. 2.

FIG. 2 shows one modification of the above-described voltage detector. In the modification, the electrically conductive electrode 64 is not provided. As shown in FIG. 3, lines of electric force ELN formed by a voltage developing in a selected area of an object 5 under test extend from the object 5 and terminate at the object 5, thus forming loops. Therefore, when the end portion 3 of the optical probe 4 is brought near or into contact with the selected area of the object 5 as shown in FIG. 3, then the refractive index of the end portion 3 is changed with the electric field strength of the lines of electric force ELN. The voltage in the selected area of the object 5 can be detected from the variation of the refractive index of the end portion, similarly as in the above-described case. As was described above, the voltage detector of FIG. 2 can detect voltages, although its optical probe is not provided with the electrically conductive terminal 64. This contributes to simplification of the construction of the voltage detector.

In order to prevent occurrence of unwanted light reflection from the wall of the optical probe 1 or 4 and the surface of the end portion 3, it is preferable to paint the optical probe black except for the portion corresponding to the optical paths of the input and output light beams.

It is preferable to dispose a light isolator between the light source 53 (actually the collimator 94) and the polarizing beam splitter 56 to prevent part of the return light beam from going back to the light source 53 and causing an unstable operation of the light source 53.

The polarizing beam splitter 56 may be replaced by a half-mirror or a mere beam splitter. In this case, it is required to extract a predetermined polarization component before the input light beam enters the half-mirror or a beam splitter and after the output light beam emerges from that.

The above-described voltage detector may employ a pulse light source emitting extremely short pulse light as the light source, and a photoelectric converter may be used to detect the intensity of the output light beam. In this case, the high-speed variation in voltage of the object under test can be sampled with a considerably short time period.

Furthermore, in the above-described voltage detector, a CW light source may be employed as the light source, and a fast response detector such as a streak camera may be used as the detector. In this case, the high-speed variation in voltage of the object under test can be detected with high time resolution and with high accuracy.

Moreover, a following modification is also feasible. That is, a voltage detector comprises: a parallel input light beam which is obtained by passing the light beam through a slit; an electro-optic material with a shape of a right-angled prism; and a one-dimensional photodetector for detecting the output light beam. With this constitution, voltage variations at one-dimensional positions in the object can be detected at the same time. In this modification with the electro-optic material of the right-angled prism shape, the same advantages as in the embodiments employing the corner-cube-shaped end portion can be expected with respect to the parallel light beam, in contrast with the case employing a mere reflection mirror.

As is apparent from the above description, the voltage detector is made simple in construction. Furthermore, since the end portion of the electro-optic material in the optical probe has the corner-cube shape, the detection of the voltage developing in the selected area of the object under test can be accurately achieved, substantially being free from the incidence condition of light to the end portion of the electro-optic material.

What is claimed is:

1. A voltage detector for detecting a voltage developing in a selected area of an object to be measured, comprising:
    a light source for emitting a light beam;
    a voltage-sensing part including an electro-optic material for sensing said voltage in said object as a change of a refractive index thereof, an end portion of said electro-optic material having a corner-cube shape;
    splitting and extracting means for extracting a light beam with a first predetermined polarization component from a light beam introduced from said light source which is launched into said electro-optic material as an input light beam, and extracting an output light beam with a second predetermined polarization component from an output light beam emerging from said electro-optic material after reflecting from said end portion of said material; and
    detection means for determining said voltage developing in said object on the basis of intensity of said output light beam with said second predetermined polarization component.

2. A voltage detector as claimed in claim 1, wherein said splitting and extracting means further extracts a reference light beam from said light beam introduced from said light source; and
    said detection means determines said voltage on the basis of intensity of said reference light beam and intensity of said output light beam with said second predetermined polarization component.

3. A voltage detector as claimed in claim 1, wherein said splitting and extracting means comprises a polarizing beam splitter.

* * * * *